United States Patent
Girardi

(10) Patent No.: US 10,426,043 B2
(45) Date of Patent: Sep. 24, 2019

(54) METHOD OF THIN FILM ADHESION PRETREATMENT

(71) Applicant: Honeywell Federal Manufacturing & Technologies LLC, Kansas City, MO (US)

(72) Inventor: Michael Girardi, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 207 days.

(21) Appl. No.: 15/241,336

(22) Filed: Aug. 19, 2016

(65) Prior Publication Data
US 2018/0054899 A1 Feb. 22, 2018

(51) Int. Cl.
| | | |
|---|---|---|
| H05K 3/38 | (2006.01) | |
| H05K 1/02 | (2006.01) | |
| H05K 3/00 | (2006.01) | |
| H05K 3/02 | (2006.01) | |
| H05K 3/14 | (2006.01) | |
| H05K 3/16 | (2006.01) | |
| H05K 1/03 | (2006.01) | |

(52) U.S. Cl.
CPC .......... *H05K 3/381* (2013.01); *H05K 1/0298* (2013.01); *H05K 3/0017* (2013.01); *H05K 3/027* (2013.01); *H05K 3/146* (2013.01); *H05K 3/16* (2013.01); *H05K 1/0306* (2013.01); *H05K 2201/0317* (2013.01); *H05K 2203/0522* (2013.01); *H05K 2203/0585* (2013.01); *H05K 2203/092* (2013.01)

(58) Field of Classification Search
CPC .............. H05K 1/0298; H05K 1/0306; H05K 2201/0317; H05K 2203/0522; H05K 3/0017; H05K 3/027; H05K 3/146
See application file for complete search history.

(56) References Cited

U.S. PATENT DOCUMENTS

| | | | | |
|---|---|---|---|---|
| 4,604,298 A | | 8/1986 | Shevtchuk et al. | |
| 4,761,332 A | * | 8/1988 | Elias | C04B 41/4572 428/325 |
| 5,370,766 A | * | 12/1994 | Desaigoudar | H01L 23/5227 204/192.2 |

(Continued)

FOREIGN PATENT DOCUMENTS

| | | |
|---|---|---|
| CN | 102110616 | 9/2012 |
| JP | 06-064988 A | 3/1994 |

(Continued)

OTHER PUBLICATIONS

International Search Report and Written Opinion for PCT Appln. No. PCT/US2017/041473; Filed Jul. 7, 2017.

*Primary Examiner* — Minh N Trinh
(74) *Attorney, Agent, or Firm* — Hovey Williams LLP

(57) ABSTRACT

A circuit board comprising a substrate and a circuit trace. The substrate includes a surface etched via ion milling over a circuit area such that the surface has an increased roughness. The circuit trace forms portions of an electronic circuit and may be created from a thin conductive film deposited on the surface within the circuit area. The circuit trace adheres more strongly to the roughened substrate surface, which prevents the circuit trace from peeling or becoming delaminated from the substrate surface.

10 Claims, 3 Drawing Sheets

(56) References Cited

U.S. PATENT DOCUMENTS

| | | | |
|---|---|---|---|
| 7,012,327 B2 | 3/2006 | Huff et al. | |
| 7,229,936 B2 * | 6/2007 | Brodsky | G03F 7/091 |
| | | | 438/790 |
| 7,560,225 B2 * | 7/2009 | Camacho | G03F 7/40 |
| | | | 216/66 |
| 8,336,193 B2 * | 12/2012 | Fukushima | B82Y 10/00 |
| | | | 204/192.1 |
| 8,551,349 B2 * | 10/2013 | Fukushima | G11B 5/66 |
| | | | 216/22 |
| 2008/0009140 A1 * | 1/2008 | Williamson | G01R 31/2898 |
| | | | 438/706 |
| 2011/0089967 A1 | 4/2011 | Kim | |
| 2013/0180773 A1 * | 7/2013 | Chiang | C23C 18/1879 |
| | | | 174/268 |
| 2018/0054899 A1 * | 2/2018 | Girardi | H05K 1/0298 |

FOREIGN PATENT DOCUMENTS

| | | |
|---|---|---|
| JP | 06-302936 A | 10/1994 |
| JP | 08-023152 A | 1/1996 |
| JP | 2012-112028 A | 6/2012 |

* cited by examiner

METHOD OF THIN FILM ADHESION PRETREATMENT

STATEMENT REGARDING FEDERALLY-SPONSORED RESEARCH OR DEVELOPMENT

This invention was made with Government support under Contract No.: DE-NA0000622 awarded by the United States Department of Energy/National Nuclear Security Administration. The Government has certain rights in the invention.

BACKGROUND

Printed circuit boards (PCBs) are often used for forming complex circuits. Circuit paths for circuits can easily be designed via computer software and then printed or deposited on PCB substrates, such as wafer boards, to form circuit traces. Electrical components such as resistors, capacitors, transistors, and other elements can then be easily soldered or otherwise connected to the circuit traces. However, circuit traces often peel away or become delaminated from the substrates, which results in reduced circuit performance or even circuit failure.

SUMMARY

Embodiments of the invention solve the above-mentioned problems and provide a distinct advancement in the art of circuit boards. More particularly, the invention provides a circuit board that does not peel or delaminate.

An embodiment of the invention is a circuit board comprising a substrate and a circuit trace. The substrate includes a surface etched via ion milling over a circuit area such that the surface has an increased roughness. The circuit trace forms portions of an electronic circuit and may be created from a thin conductive film deposited on the surface within the circuit area. The circuit trace adheres to the roughened substrate surface, which prevents the circuit trace from peeling or becoming delaminated from the substrate surface.

Another embodiment of the invention is a method of pretreating a circuit board substrate for thin film adhesion. The method comprises ion milling a surface of the substrate over an entire circuit area such that a roughness of the circuit area is increased for improving adhesion thereto. The ion milling may roughen the surface area by preferentially removing glass phase particles from the substrate surface such that mostly or only alumina or other particles remain.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
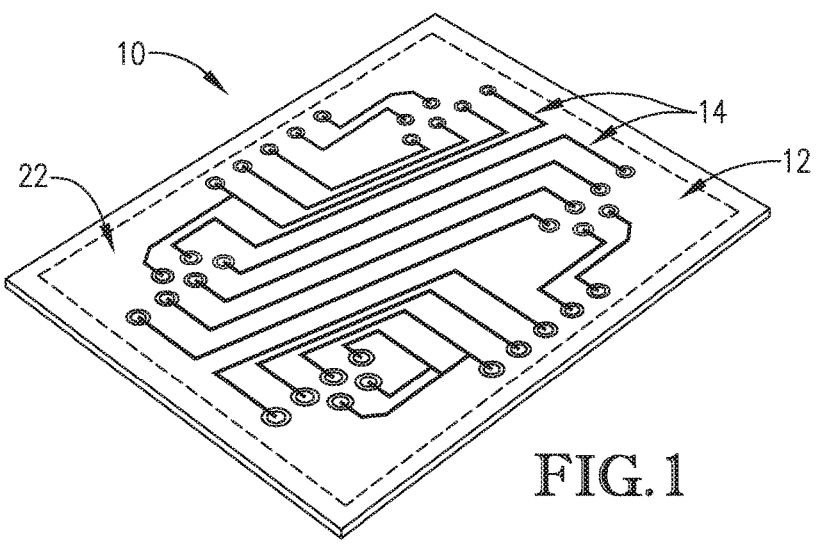
FIG. 1 is a perspective view of a circuit board constructed in accordance with an embodiment of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 2:
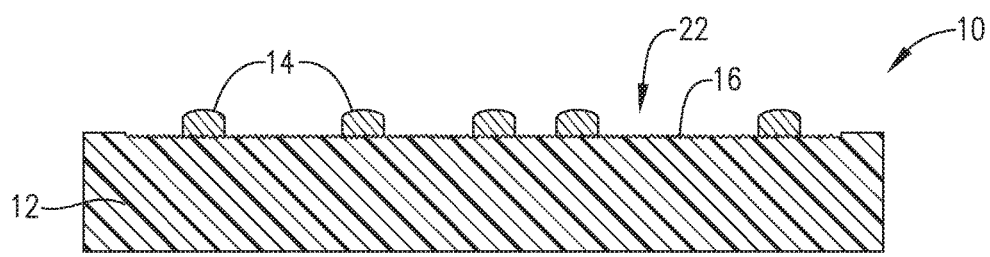
FIG. 2 is a vertical cross section of the circuit board of FIG. 1.
Figure 3:
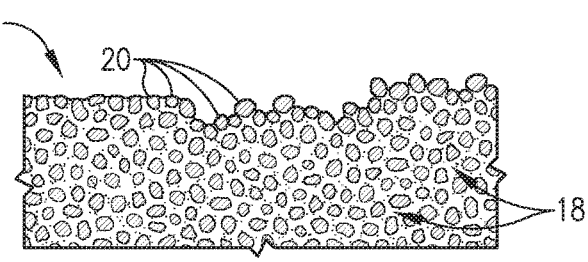
FIG. 3 is a microscopic view of alumina phase and glass phase of the substrate of the circuit board of FIG. 1.

Turning to FIGS. 1-3, a circuit board 10 constructed in accordance with an embodiment of the invention is illustrated. The circuit board 10 broadly comprises a substrate 12 and a number of circuit traces 14. Resistors, capacitors, transistor, and/or other circuitry may later be connected to the circuit traces 14 to form a circuit component.

The substrate 12 supports the circuit traces 14 thereon and includes a surface 16 comprising a glass phase 18 (e.g., silica grains or $SiO_2$ particles) and an alumina phase 20 (e.g., alumina grains or $Al_2O_3$ particles). The alumina phase 20 may be surrounded by the glass phase 18 due to glass flowing to wet the alumina during the firing process. The surface 16 defines a circuit area 22 over which pre-treatment is performed and circuit features are formed.

The substrate 12 may be formed of flexible or inflexible plastic, polyester, inorganic material, organic material, a combination of materials, or any other suitable material and may be any suitable size and shape. For example, the substrate 12 may be formed of Mylar, Kapton, polyimide, polyether ether ketone, or a similar material and may be a rectangular or custom-shaped board. The substrate 12 may also be a low temperature co-fired ceramic (LTCC), high temperature co-fired ceramic (HTCC), ceramic and/or polymer composite (e.g., Rogers material), or any other suitable substrate.

The circuit traces 14 form electrical conduits and importantly adhere to the surface 16 via strong bonds created as a result of the surface 16 being ion milled during pretreatment as described in more detail below. The circuit traces 14 may be formed of metallic material such as titanium, copper, platinum, gold, or any other suitable material, or any combination thereof. In one embodiment, the circuit traces 14 form a titanium-copper-platinum-gold (TiCuPtAu) stack. The circuit traces 14 may have any thickness and width, and in one embodiment are between 0.1 micrometers and 6 micrometers thick and between 75 micrometers and 2500 micrometers wide. In another embodiment, the circuit traces 14 are between 0.1 micrometers and 10 micrometers thick and between greater than 100 micrometers wide.

Figure 4:
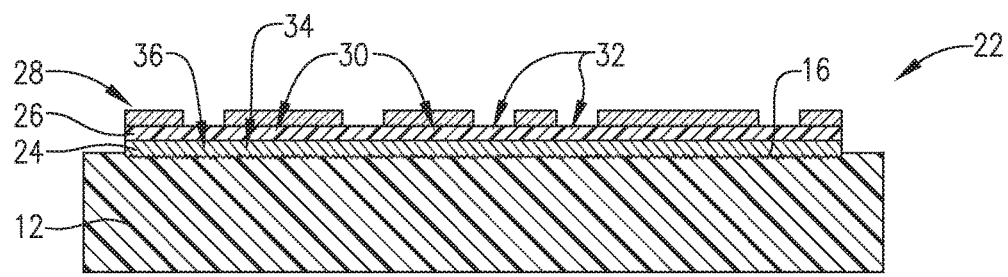
FIG. 4 is a vertical cross section view of circuit traces of the circuit board of FIG. 1 being formed.
Figure 5:
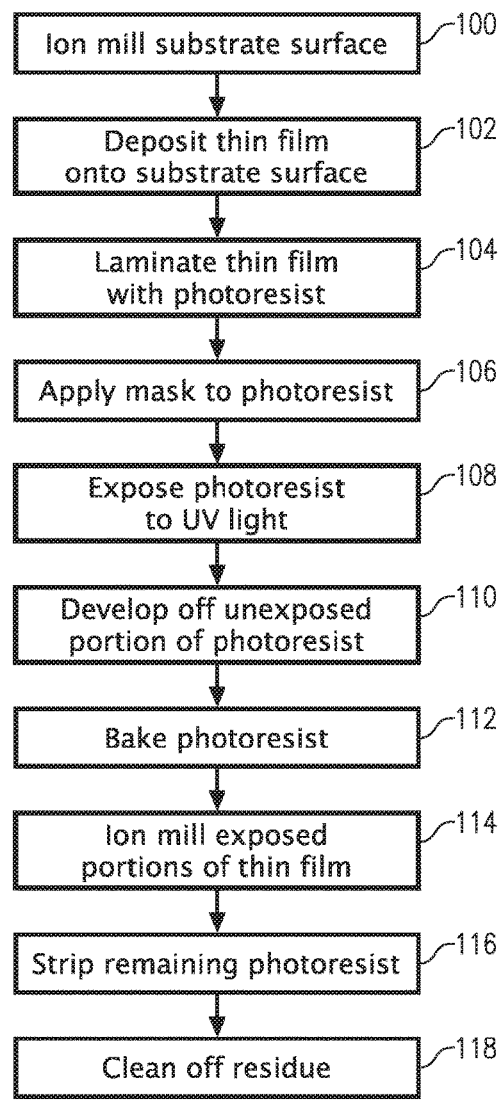
FIG. 5 is a flow diagram of a method of creating the circuit board of FIG. 1.

Turning now to FIG. 5 and with reference to FIGS. 2-4, formation of the circuit board 10 will now be described in more detail. First, the substrate surface 16 may be ion milled over the entire circuit area 22 or portions thereof, as shown in block 100 of FIG. 4. More specifically, a wide beam ion source may accelerate Argon or another suitable gas to the substrate surface 16 so as to remove between 0.1 microns to 5 microns of the substrate surface 16. To that end, some of the glass phase 18 surrounding the alumina phase 20 may be preferentially removed while much or all of the alumina phase 20 remains. The substrate surface 16 may be ion milled for a time period of up to sixty minutes, which may be performed in a vacuum or reduced pressure. In one embodiment, the substrate surface 16 may be ion milled between ten minutes and fifteen minutes. In this way, the ion milling increases the roughness of the substrate surface 16 for improving adhesion of the thin conductive film thereto.

A thin film 24 of conductive material may then be deposited on the substrate surface 16 over the entire circuit area 22 or portions thereof via physical vapor deposition (PVD), sputtering, or any other suitable form of thin film deposition, as shown in block 102. In one embodiment, the thin film 24 may be a metal stack formed of at least four metals. For example, the thin film 24 may be a titanium-copper-platinum-gold (TiCuPtAu) stack. Importantly, the thin film 24 adheres to the substrate surface 16 by forming strong bonds with the roughened substrate surface 16.

A polymer photoresist 26 may then be laminated onto the thin film 24 in preparation for photolithography, as shown in block 104. The photoresist 26 may be a 1.5 mil thick polymer deposited on the thin film 24 applied with pressure via a heated roller. That is, the photoresist 26 adheres to the thin film 24 under increased temperature and pressure.

A mask 28 (circuit negative pattern) may then be overlaid on the photoresist 26 such that the photoresist 26 includes masked portions 30 and unmasked portions 32, as shown in block 106. The mask 28 may be printed on the photoresist 28 or otherwise deposited on the photoresist 26 via precise deposition.

The unmasked portions 32 of the photoresist 26 may then be exposed to UV light so that the unmasked portions 32 of the photoresist 26 are resistant to a developing solution, as shown in block 108. Exposure time and light intensity of the UV light exposure may be varied according to the type of the photoresist 26, the thickness of the photoresist 26, the widths of the unmasked portions 32, and other factors.

The masked portions 30 may then be developed (e.g., dissolved) via a developing solution such as a sodium carbonate solution with deionized water such that the unmasked portions 32 remain, as shown in block 110. That is, the thin film 24 will have unexposed portions 34 and exposed portions 36 as a result of developing the masked portions 30 of the photoresist 26. The developing solution may be sprayed onto the photoresist 26 or otherwise deposited thereon. Time duration, temperature, and pressure of the spray or developing step may be altered as needed to ensure that the masked portions 30 are completely removed. At the completion of block 110, the photoresist 26 is patterned according to the mask 28.

The substrate 12 may then be oven baked or otherwise heated to harden the photoresist 26, as shown in block 112. Time duration, temperature, and pressure of this step may also be altered as needed to ensure that the unmasked portions are hardened.

The exposed portions 36 of the thin film 24 may then be ion milled, as shown in block 114. More specifically, For example, a wide beam ion source may accelerate Argon or another suitable gas towards the exposed portions 36 of the thin film 24 so that the exposed portions 36 are removed and the unexposed portions 34 of the thin film 24 remain.

The unmasked portions 32 of the photoresist 26, which still remain after the masked portions 34 of the photoresist are developed, may then be stripped (e.g., dissolved) via a KOH solution or similar solution, as shown in block 116. This leaves the unexposed portions 24 (now exposed) of the thin film 24 as the desired circuit traces 14 of the circuit board 10. The circuit board 10 may then be cleaned by removing KOH solution residue via an acetone rinse or other similar cleaner, as shown in block 118.

Figure 6:
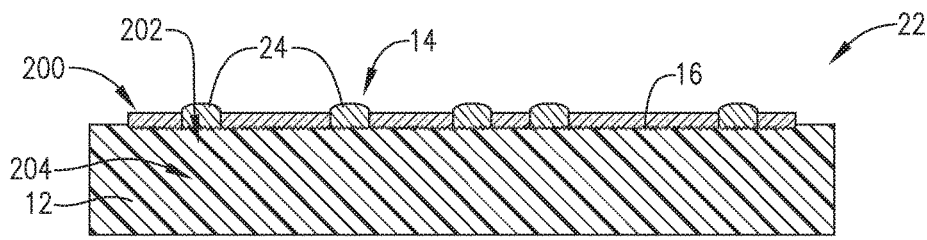
FIG. 6 is a vertical cross section view of circuit traces being formed via a negative mask.
Figure 7:
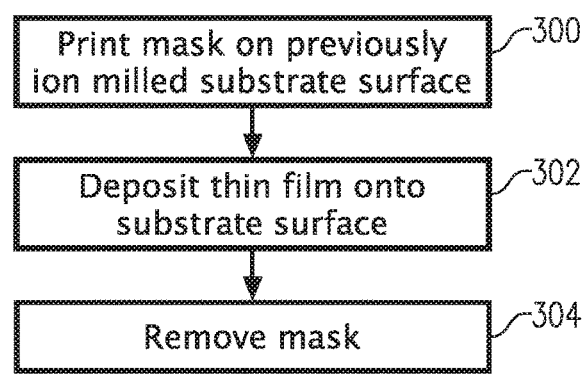
FIG. 7 is a flow diagram of forming circuit traces via a negative mask.

Turning now to FIG. 7 and with reference to FIG. 6, the circuit traces 14 may alternatively be formed as follows. First, a mask 200 may be printed or otherwise deposited on the previously ion milled substrate surface 16 such that the substrate surface 16 includes exposed portions 202 and unexposed portions 204, as shown in block 300. The mask 200 may be a metal mask or any other suitable mask.

The thin film 24 may then be deposited so as to adhere to the exposed portions 202 of the substrate surface 16, as shown in block 302. Some of the thin film 24 may overlap the mask 200 or may even cover the mask 200.

The mask 200 may then be removed so that the thin film 24 remains, thus forming the circuit traces 14, as shown in block 304. Undesired portions of the thin film 24 may also be removed with the mask 200.

Resistors, capacitors, transistors, and/or other circuitry may then be connected to the circuit traces 14 to form a circuit component. For example, resistors may be soldered to leads of adjacent circuit traces 14 so as to form a resistive circuit therebetween. The circuit traces 14 may also be connected to circuit traces of other circuit boards via wires or other connectors for forming multi-circuit board circuits.

The above-described circuit board 10 and method of forming circuit boards provide several advantages over conventional circuit boards. For example, the roughened substrate surface 16 increase adhesion between the substrate 12 and the circuit traces 14. This prevents peeling and/or delamination (both small-scale delamination and large-scale delamination) of the circuit traces 14. Etching the substrate 12 via ion milling is a dry process that may be faster and more accurate than baking, plasma cleaning, in situ radio frequency etching, and fine polishing. The circuit traces 14 may also easily be formed via photolithography and ion milling to have complex shapes and precise depth changes, edges, and boundaries for forming complex and multi-layered circuit traces.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of thin film adhesion pretreatment, the method comprising the steps of:
    providing a substrate having a first surface, the substrate including $SiO_2$ glass phase particles and particles of at least one other material; and
    preferentially removing some of the glass phase particles from the substrate via ion milling the first surface of the substrate so that most of the particles of the at least one other material are unremoved for improving the thin film adhesion.

2. The method of claim 1, wherein the step of preferentially removing some of the glass phase particles from the substrate includes removing between approximately 0.1 micrometers to 5 micrometers of surface material.

3. The method of claim 1, wherein the step of preferentially removing some of the glass phase particles from the substrate includes accelerating a gas from a wide beam ion source into the first surface of the substrate so that the gas removes some of the glass phase particles from the substrate.

4. The method of claim 3, wherein accelerating a gas from a wide beam ion source into the first surface of the substrate includes accelerating Argon from a wide beam ion source into the first surface of the substrate.

5. The method of claim 1, further comprising the step of creating a vacuum around the substrate, the step of preferentially removing some of the glass phase particles from the substrate including preferentially removing some of the glass phase particles from the substrate in the vacuum.

6. The method of claim 1, wherein the step of preferentially removing some of the glass phase particles from the substrate includes preferentially removing some of the glass phase particles from the substrate for between approximately ten minutes to approximately sixty minutes.

7. The method of claim 1, wherein the step of preferentially removing some of the glass phase particles from the substrate includes removing some of the glass phase particles from a portion of the first surface.

8. The method of claim 1, wherein the step of preferentially removing some of the glass phase particles from the substrate includes ion milling the first surface for sixty minutes or less.

9. The method of claim 1, further comprising the step of reducing pressure around the substrate, the step of preferentially removing some of the glass phase particles from the substrate including preferentially removing some of the glass phase particles from the substrate in the reduced pressure.

10. A method of thin film adhesion pretreatment, the method comprising the steps of:
    providing a low temperature co-fired ceramic substrate having a first surface defining a circuit area, the substrate including $SiO_2$ glass phase particles and alumina phase particles;
    creating a vacuum around the low temperature co-fired ceramic substrate; and
    preferentially removing between approximately 0.1 micrometers to approximately 5 micrometers of the $SiO_2$ glass phase particles from the circuit area of the first surface of the substrate via ion milling the circuit area of the first surface of the substrate in the vacuum for between approximately ten minutes to approximately sixty minutes so that most of the alumina phase particles are unremoved for improving the thin film adhesion.

* * * * *